(12) United States Patent
Jung

(10) Patent No.: US 7,259,092 B2
(45) Date of Patent: Aug. 21, 2007

(54) SEMICONDUCTOR DEVICE AND METHOD FOR FABRICATING THE SAME

(75) Inventor: Byung Hyun Jung, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/930,164

(22) Filed: Aug. 30, 2004

(65) Prior Publication Data

US 2005/0046028 A1 Mar. 3, 2005

(30) Foreign Application Priority Data

Sep. 2, 2003 (KR) .................. 10-2003-0061060

(51) Int. Cl.
*H01L 21/4763* (2006.01)

(52) U.S. Cl. .................. 438/637; 438/656; 438/677

(58) Field of Classification Search ................ 438/637, 438/643, 656, 677
See application file for complete search history.

(56) References Cited

U.S. PATENT DOCUMENTS

| | | |
|---|---|---|
| 4,789,648 A | 12/1988 | Chow et al. |
| 4,944,836 A | 7/1990 | Beyer et al. |
| 5,008,216 A | 4/1991 | Huang et al. |
| 5,008,730 A | 4/1991 | Huang et al. |
| 5,401,675 A | 3/1995 | Lee et al. |
| 5,403,779 A | 4/1995 | Joshi et al. |
| 5,760,475 A | 6/1998 | Cronin et al. |

(Continued)

FOREIGN PATENT DOCUMENTS

KR 1019990012246 4/1999

(Continued)

OTHER PUBLICATIONS

Kawabataguninori et al.; Semiconductor Memory Device; Korean Patent Abstract; Publication No. 1020000005622; Publication Date Jan. 25, 2000: Korean Intellectual Property Office.

(Continued)

*Primary Examiner*—Fernando L. Toledo
(74) *Attorney, Agent, or Firm*—Andrew D. Fortney

(57) ABSTRACT

A semiconductor device and a method for fabricating the same is disclosed, to prevent a defective contact of a line in a method of completely filling a minute contact hole having a high aspect ratio with a refractory metal layer, which includes the steps of forming a contact hole in an insulating interlayer of a semiconductor substrate; depositing a barrier metal layer on an inner surface of the contact hole and an upper surface of the insulating interlayer, wherein the process of depositing the barrier metal is performed by sequentially progressing one cycle of: injecting a reaction gas of $SiH_4$ to the chamber, injecting a first purging gas to the chamber, injecting a reaction gas of $WF_6$ to the chamber; injecting a second purging gas to the chamber, injecting a reaction gas of $NH_3$ to the chamber, and injecting a third purging gas to the chamber; depositing a first metal layer for nucleation on the barrier metal layer by the atomic layer deposition process; and depositing a second metal layer on the first metal layer inside the contact hole, to fill the contact hole completely.

20 Claims, 6 Drawing Sheets

U.S. PATENT DOCUMENTS

| | | | |
|---|---|---|---|
| 5,889,328 A | 3/1999 | Joshi et al. | |
| 6,052,301 A | 4/2000 | Ikeda et al. | |
| 6,358,829 B2* | 3/2002 | Yoon et al. | 438/597 |
| 6,869,876 B2* | 3/2005 | Norman et al. | 438/680 |
| 6,936,538 B2* | 8/2005 | Byun | 438/680 |
| 7,005,372 B2* | 2/2006 | Levy et al. | 438/627 |
| 2003/0059980 A1* | 3/2003 | Chen et al. | 438/118 |
| 2005/0009325 A1* | 1/2005 | Chung et al. | 438/637 |
| 2005/0054196 A1* | 3/2005 | Wu et al. | 438/680 |

FOREIGN PATENT DOCUMENTS

KR    1020000049576    8/2000

OTHER PUBLICATIONS

Jang Ung Eom et al; Method for Forming Tungsten Gate; Korean Patent Abstract; Publication No. 1020020016312; Publication Date Mar. 3, 2002; Korean Intellectual Property Office.

* cited by examiner

SEMICONDUCTOR DEVICE AND METHOD FOR FABRICATING THE SAME

This application claims the benefit of the Korean Application No. P2003-61060 filed on Sep. 2, 2003, which is hereby incorporated by reference.

BACKGROUND OF THE INVENTION

1. Field of the Invention

The present invention relates to a semiconductor device and a method for fabricating the same, and more particularly, to a semiconductor device and a method for fabricating the same, to completely fill a minute contact hole having a high aspect ratio with a refractory metal layer.

2. Discussion of the Related Art

In general, with high integration of a semiconductor device, a MOS (metal oxide semiconductor) transistor, one component of the semiconductor device, becomes minute. Thus, source and drain electrodes and a gate electrode, provided in the MOS transistor, decrease, and a metal line decreases. As the decrease of the metal line, it is necessary to decrease a contact hole between the gate electrode and the metal line, and between the source/drain electrodes and the metal line. Accordingly, a contact resistance between the gate electrode and the metal line increases, thereby increasing a resistance of the metal line. As a result, an operation speed of the semiconductor device is lowered. However, there is a growing demand on the high integration and the rapid operation speed of the semiconductor device.

To meet this demand, a refractory metal layer is formed in the contact hole or via-hole, to decrease the contact resistance. For example, a method of forming a plug of a tungsten layer is used in general.

A method of forming a plug according to the related art will be described as follows.

FIG. 1 is a cross sectional view of a defective contact having a void in a contact hole of a semiconductor device according to the related art.

As shown in FIG. 1, an insulating interlayer 11 is deposited on a semiconductor substrate 10 having a contact region. Then, a contact hole 12 for exposing the contact region is formed in the insulating interlayer 11. To decrease a contact resistance, a barrier metal layer 13 is deposited on an inner surface of the contact hole 12 and an upper surface of the insulating interlayer 11 by a reactive sputtering process, and a tungsten layer 15 is thickly deposited on the insulating interlayer 11 at a thickness suitable for filling the inside of the contact hole 12. At this time, the barrier metal layer 13 is formed of titanium nitride (TiN) or tungsten nitride (WN).

However, if the contact hole 12 has a size (diameter) below 0.2 μm, and has a great depth, an aspect ratio (ratio of a depth to a size of the contact hole) of the contact hole is above 5. In case of the contact hole having the high aspect ratio above 5, it is impossible to form the barrier metal layer 13 on the entire inner surface of the contact hole 12 with uniformity and continuity. That is, the barrier metal layer 13 is not deposited on some of the inner surface of the contact hole 12. As a result, the tungsten layer 15 is not formed in the entire space of the contact hole, whereby it is difficult to fill the contact hole 12 completely. That is, an empty space such as a void 16 appears in a lower side of the contact hole 12, whereby it may cause the electric disconnection of the metal line in the contact hole 12, or it may cause the degradation of reliability of the metal line to electromigration or stressmigration.

SUMMARY OF THE INVENTION

Accordingly, the present invention is directed to a semiconductor device and a method for fabricating the same that substantially obviates one or more problems due to limitations and disadvantages of the related art.

An object of the present invention is to a semiconductor device and a method for fabricating the same, to prevent a defective contact of a line in a method of completely filling a minute contact hole having a high aspect ratio with a metal layer (e.g. tungsten).

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a semiconductor device includes the steps of forming a contact hole in an insulating interlayer of a semiconductor substrate; depositing a barrier metal layer on an inner surface of the contact hole and an upper surface of the insulating interlayer, wherein the process of depositing the barrier metal is performed by sequentially progressing one cycle of: injecting a reaction gas of $SiH_4$ to the chamber, injecting a first purging gas to the chamber, injecting a reaction gas of $WF_6$ to the chamber; injecting a second purging gas to the chamber, injecting a reaction gas of $NH_3$ to the chamber, and injecting a third purging gas to the chamber; depositing a first metal layer for nucleation on the barrier metal layer by the atomic layer deposition process; and depositing a second metal layer on the first metal layer inside the contact hole, to fill the contact hole completely.

At this time, the process of depositing the barrier metal layer and the first metal layer is progressed on the same chamber.

Also, the barrier metal layer is formed of a WSiN monatomic layer.

Also, the WSiN monatomic layer is deposited at a thickness of 20 Å to 10 Å.

Also, the reaction gas of $SiH_4$ is injected to the chamber at a flux of 50 to 100 SCCM.

Also, the reaction gas of $WF_6$ is injected to the chamber at a flux of 10 to 50 SCCM.

Also, the reaction gas of $NH_3$ is injected to the chamber at a flux of 30 to 80 SCCM.

Also, the reaction gas of $SiH_4$ and $WF_6$ is injected at a ratio from 4 to 1 to 7 to 1.

Also, the first, second, and third purging gas is used of any one of argon gas, or mixing gas of argon gas and hydrogen gas.

Also, the WSiN layer is deposited in state of maintaining the chamber at a temperature between 200° C. and 600° C.

Also, the first, and second metal layers are formed of a tungsten material.

Also, the process of forming the first metal layer of the tungsten material is performed by sequentially progressing one cycle of injecting a reaction gas of $SiH_4$ to the chamber; injecting a first purging gas to the chamber; injecting a reaction gas of $WF_6$ to the chamber; injecting a second purging gas to the chamber; injecting a reaction gas of $NH_3$ to the chamber; and injecting a third purging gas to the chamber.

Also, the first metal layer of the tungsten material is formed at a thickness of 20 Å to 100 Å.

Also, the first, second, and third purging gas is used of any one of argon gas, or mixing gas of argon gas and hydrogen gas.

Also, the second metal layer is deposited by CVD (chemical vapor deposition).

In another aspect, a semiconductor device includes a semiconductor substrate; an insulating interlayer having a contact hole and formed on the semiconductor substrate; a barrier metal layer formed on an inner surface of the contact hole; a first metal layer for nucleation formed on the barrier metal layer inside the contact hole; and a second metal layer on the first metal layer inside the contact hole, to fill the contact hole.

At this time, the barrier metal layer is formed of a WSiN layer.

Also, the first and second metal layers are formed of a tungsten material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a semiconductor device according to the present invention and a method for fabricating the same will be described with reference to the accompanying drawings.

Figure 1:
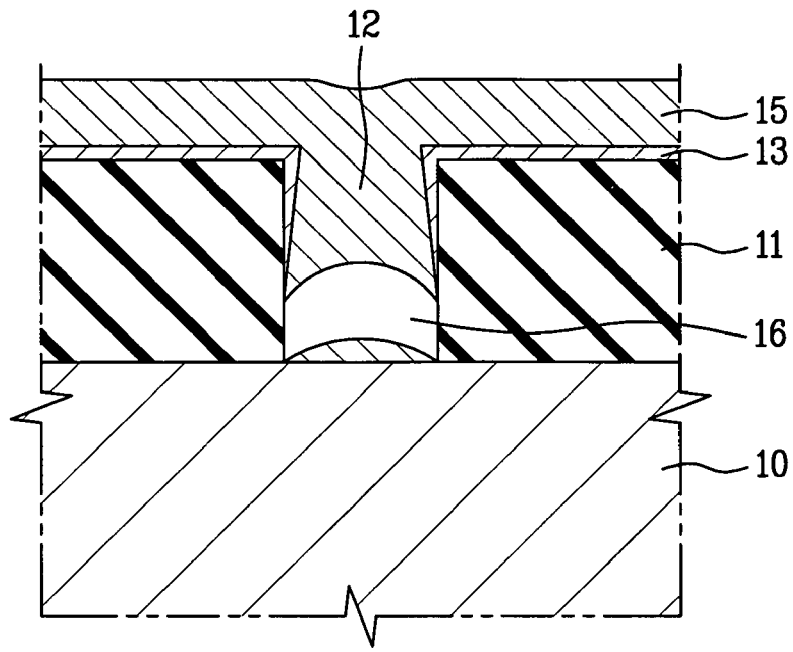
FIG. 1 is a cross sectional view of a defective contact having a void in a contact hole of a semiconductor device according to the related art.
Figure 2:
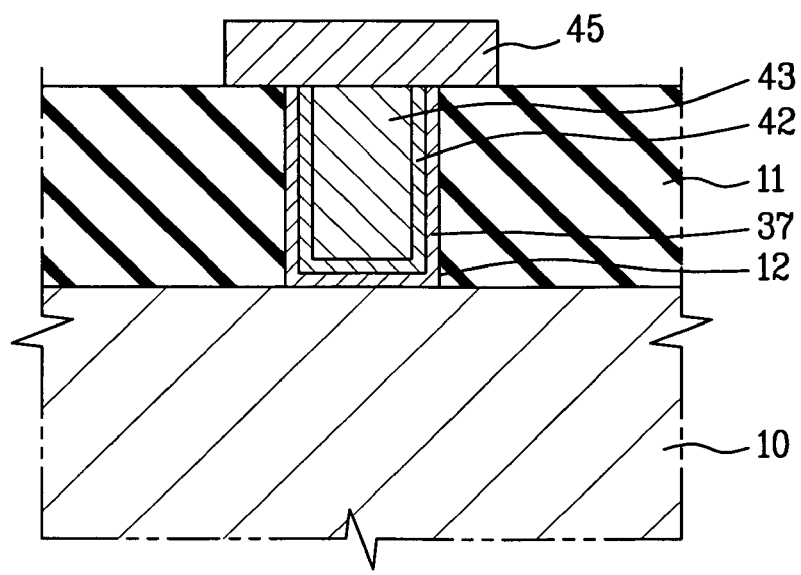
FIG. 2 is a cross sectional view of a contact hole in a semiconductor device according to the present invention.

FIG. 2 is a cross sectional view of a contact hole in a semiconductor device according to the present invention.

As shown in FIG. 2, a semiconductor device according to the present invention includes a semiconductor substrate 10, an insulating interlayer 11, a WSiN layer 37, a first tungsten layer 42, and a second tungsten layer 43. At this time, the semiconductor substrate 10 has a contact region, and the insulating interlayer 11 having a contact hole 12 corresponding to the contact region of the semiconductor substrate 10 is formed on the semiconductor substrate 10. Then, the WSiN layer 37 is formed as a barrier metal layer on an inner surface of the contact hole 12 and an upper surface of the insulating interlayer 11. Also, the first tungsten layer 42 for nucleation is formed on the WSiN layer 37, and the second tungsten layer 43 is formed on the first tungsten layer 42 to completely fill the contact hole 12. In addition, an aluminum layer 45 is formed on the insulating interlayer 11, wherein the aluminum layer 45 is electrically connected with the second tungsten layer 43.

In the semiconductor device according to the present invention, the WSiN layer 37 is formed in the minute contact hole 12 having a high aspect ratio, with uniformity and continuity. Also, the first tungsten layer 42 for nucleation is formed on the WSiN layer 37 with uniformity and continuity. As a result, it is possible to completely fill the contact hole 12 with the second tungsten layer 43.

A method for fabricating the semiconductor device will be described as follows.

FIG. 3A to FIG. 3I are cross sectional views of a method for fabricating a semiconductor device according to the present invention.

Figure 3A:
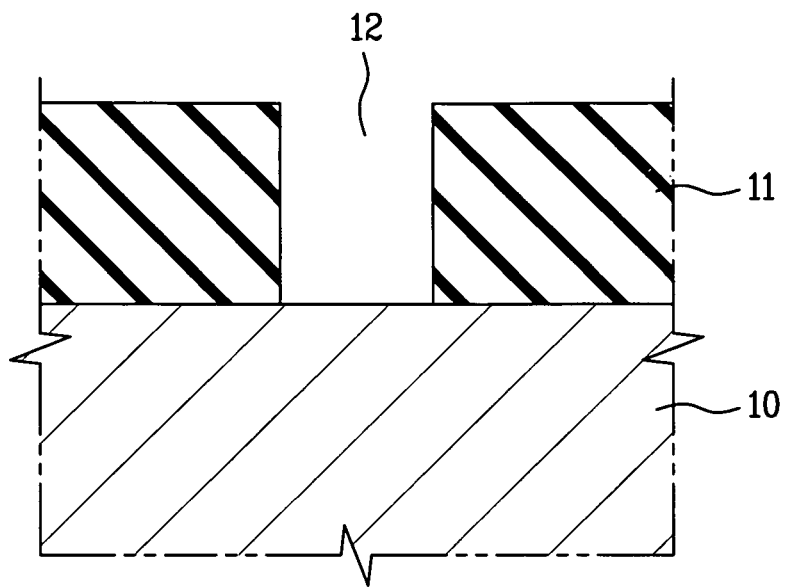
FIG. 3A to FIG. 3I are cross sectional views of a method for fabricating a semiconductor device according to the present invention.

As shown in FIG. 3A, the insulating interlayer 11 of an oxide layer is thickly formed on the semiconductor substrate 10 having the contact region. That is, in case of forming the semiconductor device of an MOS transistor, although not shown, the semiconductor substrate 10 is defined as a field area and an active area by a normal process, and then a field oxide layer or a device isolation layer is formed in the field area. Subsequently, a gate insulating layer and a conductive layer are deposited in the active area, and selectively removed, thereby forming a gate electrode and a gate insulating layer. Thereafter, impurity ions are implanted to the active area of the semiconductor substrate by using the gate electrode as a mask, thereby forming source/drain regions. Then, the insulating interlayer is formed on an entire surface of the semiconductor substrate including the gate electrode.

As described above, the insulating interlayer is formed on the entire surface of the semiconductor substrate after forming the gate electrode and the source/drain regions. Then, it is required to progress a process of forming the contact hole to connect a metal line with the source/drain regions or the gate electrode. Thus, the insulating interlayer 11 corresponding to the contact region (the gate electrode or the source/drain regions) of the semiconductor substrate 10 is selectively removed by photolithography, thereby forming the contact hole 12. At this time, the contact hole 12 has the high aspect ratio (ratio of a depth to a size of the contact hole) above 5, also, the minute contact hole 12 has a size below 2 μm.

Referring to FIG. 3B to FIG. 3F, the semiconductor substrate 10 having the contact hole 12 is loaded to a chamber (not shown) for an ALD (atomic layer deposition) process, and then the ALD process is performed to the semiconductor substrate 10. As a result, the WSiN layer 37 is deposited on the inner surface of the contact hole 12 and the upper surface of the insulating interlayer 11, with uniformity and continuity.

This will be described in detail.

Figure 3B:
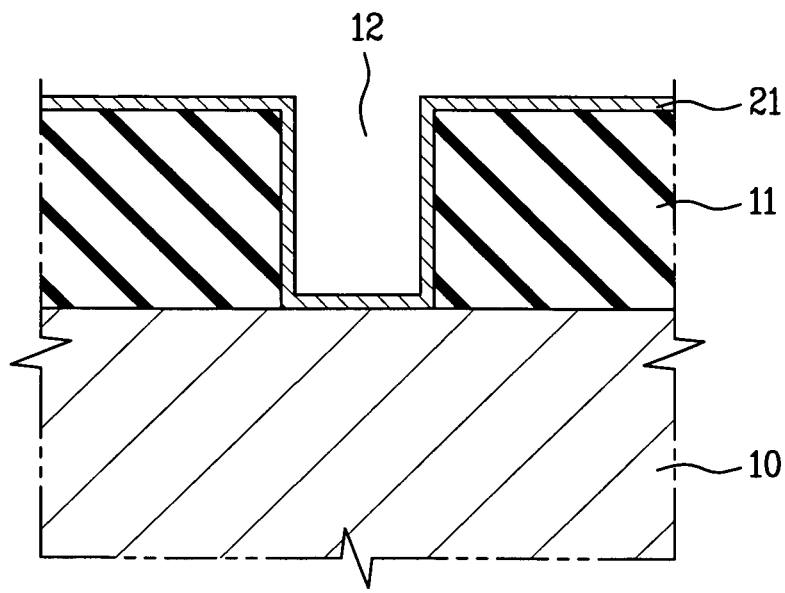

As shown in FIG. 3B, a reaction gas of $SiH_4$ is injected to the chamber at a predetermined flux of 50 to 100 SCCM (standard cubic centimeter) by an inlet. Thus, a silicon monatomic layer 21 is deposited on the inner surface of the contact hole 12 and the upper surface of the insulating interlayer 11.

Figure 3C:
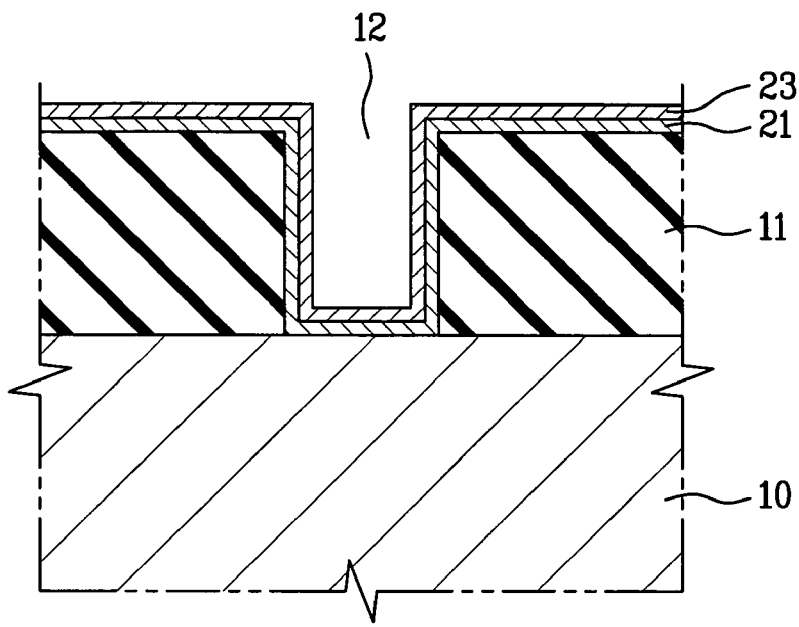

Referring to FIG. 3C, after completion of injecting the reaction gas of $SiH_4$, a purging gas, for example, an argon (Ar) gas of an inactive gas, or a mixing gas of an argon (Ar) gas and a hydrogen ($H_2$) gas, is injected to the chamber, whereby the remaining reaction gas of $SiH_4$, which is not reactive, is discharged to the external of the chamber completely.

After that, a reaction gas of $WF_6$ is injected to the chamber at a predetermined flux of 10 to 50 SCCM, whereby a tungsten monatomic layer 23 is deposited on the silicon monatomic layer 21. At this time, it is preferable to inject the reaction gas of $SiH_4$ and $WF_6$ at a ratio from 4 to 1 to 7 to 1, to prevent the silicon monatomic layer 21 inside the contact hole 12 and the surface of the semiconductor substrate from being damaged. If the reaction gas of $SiH_4$ and $WF_6$ is injected at a predetermined ratio below the ratio of 4 to 1, the semiconductor substrate, the surface of the silicon substrate, may be damaged due to F originated by $WF_6$. Or, if the reaction gas of $SiH_4$ and $WF_6$ is injected at a predetermined ratio above the ratio of 7 to 1, particles may generate. Also, the reaction gas of $SiH_4$ is injected to the chamber before injecting the reaction gas of $WF_6$, to prevent the silicon surface inside the contact hole 12 from being damaged by the reaction gas of $WF_6$.

Figure 3D:
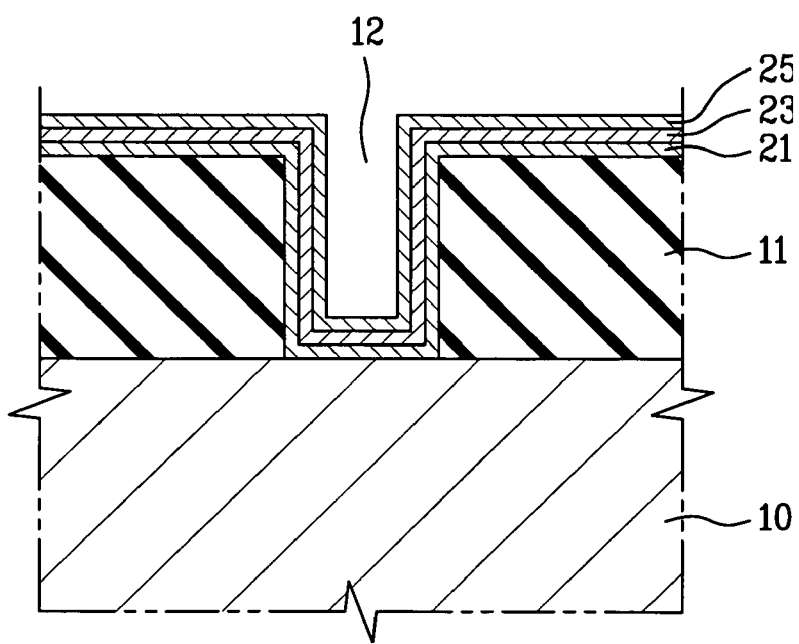

As shown in FIG. 3D, after completion of injecting the reaction gas of $WF_6$, a purging gas, for example, an argon gas of an inactive gas, or a mixing gas of an argon gas and a hydrogen gas, is injected to the chamber, whereby the remaining reaction gas of $WF_6$, which is not reactive, is discharged to the external of the chamber completely.

After that, a reaction gas of $NH_3$ is injected to the chamber at a flux of 30 to 80 SCCM, whereby a nitride monatomic layer 25 is deposited on the tungsten monatomic layer 23. Then, a purging gas, for example, an argon gas of an inactive gas, or a mixing gas of an argon gas and a hydrogen gas, is injected to the chamber, whereby the remaining reaction gas of $NH_3$, which is not reactive, is discharged to the external of the chamber completely.

Figure 3E:
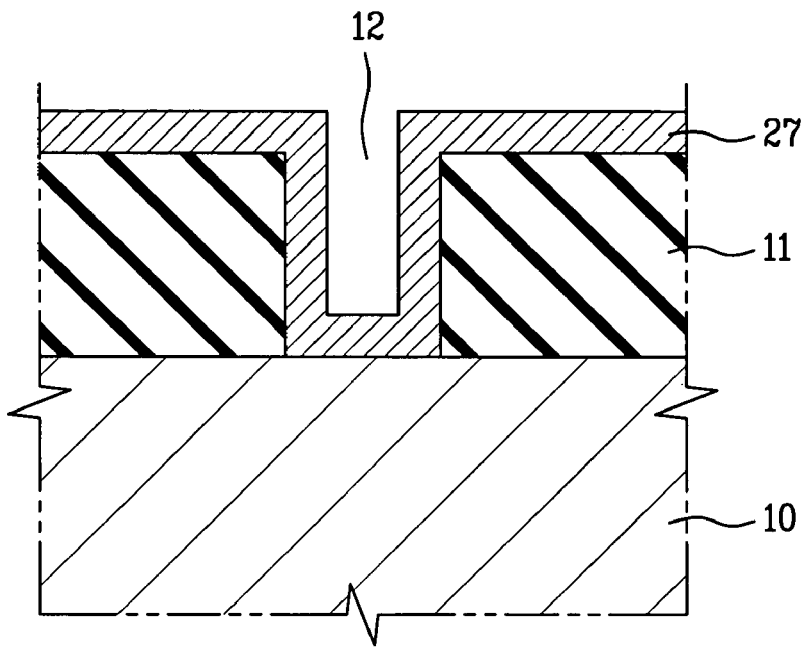

Preferably, the chamber is constantly maintained at a temperature of 200° C. to 600° C. during the ALD process of one cycle for depositing the silicon monatomic layer 21, the tungsten monatomic layer 23, and the nitride monatomic layer 25 in sequence. After deposition of the monatomic layers 21, 23, and 25, as shown in FIG. 3E, the monatomic layers 21, 23, and 25 are changed to a WSiN monatomic layer 27. At this time, the WSiN monatomic layer 27 is relatively thin at a thickness of 0.5 Å to 1.0 Å.

Figure 3F:
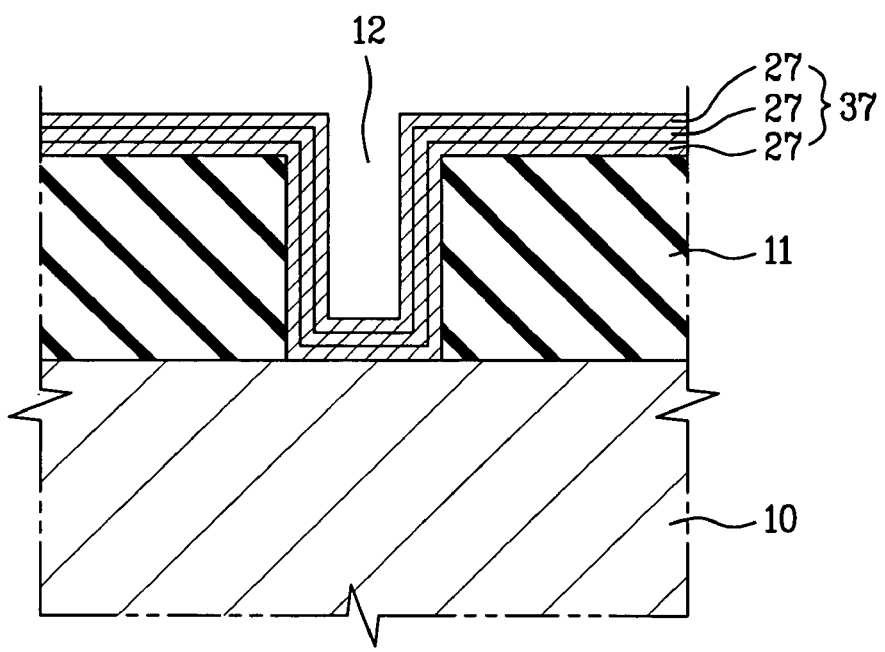

As shown in FIG. 3F, the ALD process of one cycle is repetitively performed to form the WSiN monatomic payer 27 as the barrier metal layer. That is, by repetitively depositing the WSiN monatomic layer 27, it is possible to form the WSiN layer 37 having an appropriate thickness to the wall type metal layer. At this time, it is preferable to form the WSiN layer 37 at a thickness of 20 Å to 100 Å.

Figure 3G:
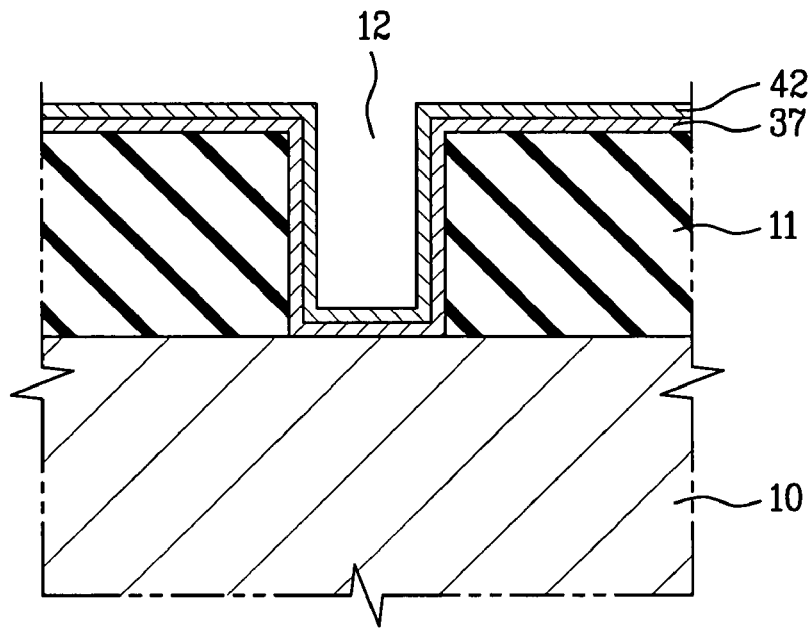

Then, as shown in FIG. 3G, the semiconductor substrate 10 is loaded to the chamber used for depositing the WSiN layer 37, or an additional chamber, and a first tungsten layer 42 is deposited on the WSiN layer 37 inside the contact hole 12 by the ALD process in a step for nucleation, with uniformity and continuity.

This will be described in detail.

First, a reaction gas of $SiH_4$ is injected to the chamber at a predetermined flux of 50 to 100 SCCM (standard cubic centimeter) by the inlet. Thus, a silicon monatomic layer (not shown) is deposited on the WSiN layer 37. Subsequently, a purging gas, for example, an argon gas of an inactive gas, or a mixing gas of an argon gas and a hydrogen gas, is injected to the chamber, whereby the remaining reaction gas of $SiH_4$, which is not reactive, is discharged to the external of the chamber completely.

After that, a reaction gas of $WF_6$ is injected to the chamber at a predetermined flux of 10 to 50 SCCM, whereby a tungsten monatomic layer (not shown) is deposited on the silicon monatomic layer. Then, a purging gas, for example, an argon gas of an inactive gas, or a mixing gas of an argon gas and a hydrogen gas, is injected to the chamber, whereby the remaining reaction gas of $WF_6$, which is not reactive, is discharged to the external of the chamber completely.

Accordingly, the tungsten monatomic layer (not shown) is deposited on the WSiN layer 37. Preferably, the chamber is constantly maintained at a temperature of 200° C. to 600° C. during the ALD process of one cycle for depositing the tungsten monatomic layer (not shown). After that, the ALD process of one cycle is repetitively performed to form the tungsten layer having a desired thickness. That is, by repetitively depositing the tungsten monatomic layer, the first tungsten layer 42 for nucleation is formed. Preferably, the first tungsten layer 42 is formed at a thickness of 20 Å to 100 Å.

In the semiconductor device according to the present invention, the first tungsten layer 42 is formed inside the contact hole 12, in the step for nucleation, with uniformity and continuity by the ALD process, whereby it is possible to fill the minute contact hole 12 having the high aspect ratio, with the second tungsten layer, completely.

Figure 3H:
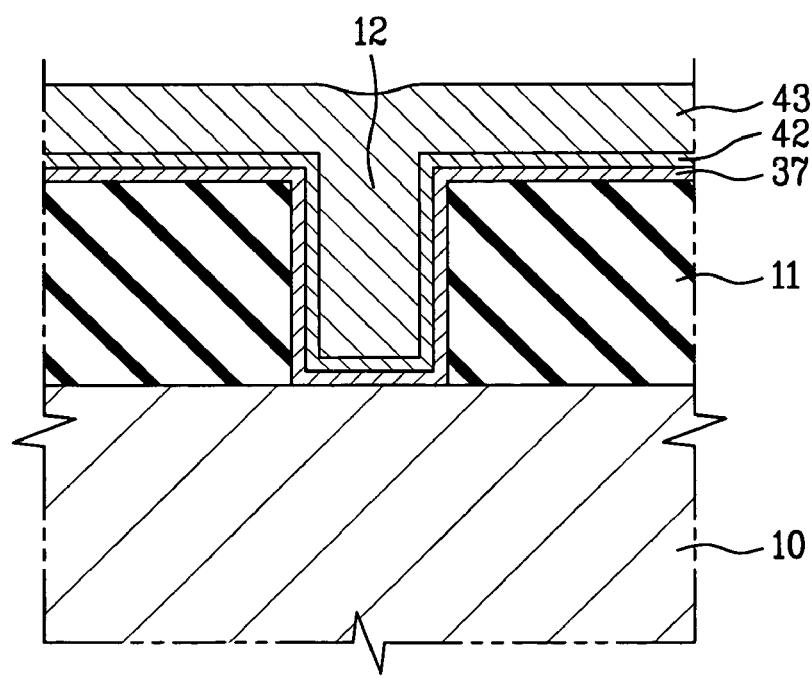

As shown in FIG. 3H, the second tungsten layer 43 is formed on the first tungsten layer 42 inside the contact hole 12 at a thickness suitable for completely filling the contact hole 12, by a normal CVD process. At this time, the second tungsten layer 43 is deposited rapidly, as compared with the first tungsten layer 42 deposited by the ALD process. Thus, the first tungsten layer 42 is formed inside the contact hole 12 with uniformity and continuity, and the second tungsten layer 43 is formed inside the minute contact hole 12 having the high aspect ratio, to fill the contact hole 12 completely. As a result, it is possible to prevent the metal line from being electrically disconnected, and to prevent degradation of reliability of the metal line to electromigration or stressmigration.

Figure 3I:
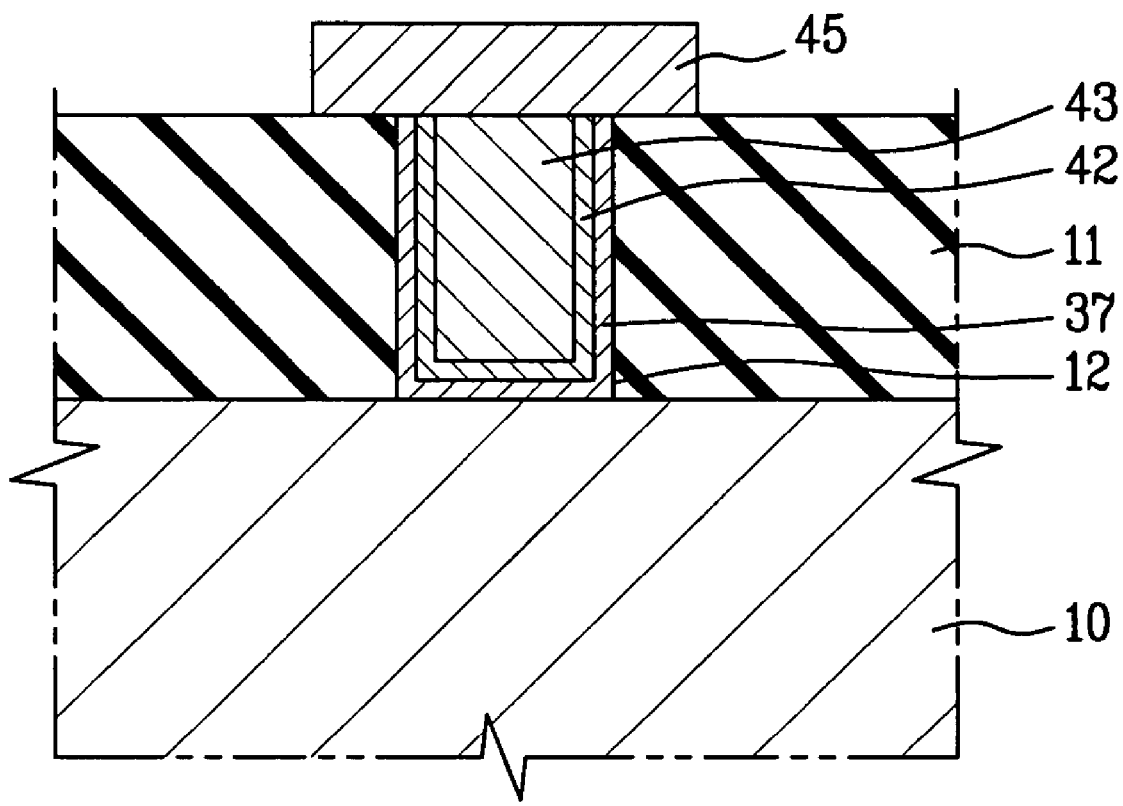

Referring to FIG. 3I, the first and second tungsten layers and the WSiN layer 37, provided outside the contact hole 12, are removed by a planarization process, for example, a CMP (chemical mechanical planarization) process, whereby the second tungsten layer 43 inside the contact hole 12 is planarized in correspondence with the insulating interlayer 11.

After that, the metal layer is formed on the second tungsten layer 43 and some of the insulating interlayer 11. For example, the aluminum layer 45 is deposited, and patterned by photolithography, whereby the aluminum layer 45 is formed as a pattern for the desired metal line.

Meanwhile, the present invention is not limited to the contact hole. That is, the present invention may be applied to a via-hole.

As mentioned above, the semiconductor device according to the present invention and the method for fabricating the same have the following advantages.

In the semiconductor device according to the present invention, the WSiN layer is deposited on the inner surface of the minute contact hole having the high aspect ratio by the ALD process, and the first tungsten layer for nucleation is deposited on the WSiN layer inside that contact hole in the step for nucleation. Then, the second tungsten layer is deposited on the first tungsten layer by the CVD process, to fill the contact hole completely.

Accordingly, the WSiN layer is deposited on the inner surface of the minute contact hole having the high aspect ratio, with uniformity and continuity, and the first tungsten layer for nucleation is deposited on the WSiN layer with uniformity and continuity, whereby it is possible to fill the minute contact hole with the second tungsten layer, completely. As a result, it is possible to prevent the metal line from being electrically disconnected in the contact hole, and to improve the reliability of the metal line to electromigration or stressmigration.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a semiconductor device comprising:
   forming a contact hole in an insulating interlayer of a semiconductor substrate;
   depositing a barrier metal layer on an inner surface of the contact hole and an upper surface of the insulating interlayer, wherein the process of depositing the barrier metal is performed by sequentially progressing one cycle of:
      injecting a reaction gas of $SiH_4$ to the chamber;
      injecting a first purging gas to the chamber;
      injecting a reaction gas of $WF_6$ to the chamber;
      injecting a second purging gas to the chamber;
      injecting a reaction gas of $NH_3$ to the chamber; and
      injecting a third purging gas to the chamber;
   depositing a first metal layer for nucleation on the barrier metal layer by the atomic layer deposition process; and
   depositing a second metal layer on the first metal layer inside the contact hole, to fill the contact hole completely.

2. The method of claim 1, wherein depositing the barrier metal layer and depositing the first metal layer are performed in the same chamber.

3. The method of claim 2, wherein the barrier metal layer comprises a WSiN monatomic layer.

4. The method of claim 3, wherein the WSiN monatomic layer has a thickness of 20 Å to 100 Å.

5. The method of claim 3, wherein the WSiN layer is deposited at a chamber temperature between 200° C. and 600° C.

6. The method of claim 1, wherein the reaction gas of $SiH_4$ is injected to the chamber at a flux of 50 to 100 SCCM.

7. The method of claim 1, wherein the reaction gas of $WF_6$ is injected to the chamber at a flux of 10 to 50 SCCM.

8. The method of claim 1, wherein the reaction gas of $NH_3$ is injected to the chamber at a flux of 30 to 80 SCCM.

9. The method of claim 1, wherein the reaction gas of $SiH_4$ and the reaction gas of $WF_6$ are injected at a ratio from 4 to 1 to 7 to 1.

10. The method of claim 1, wherein the first, second, and third purging gasses comprise argon gas.

11. The method of claim 1, wherein the first, and second metal layers comprise a tungsten material.

12. The method of claim 11, wherein the process of forming the first metal layer of the tungsten material is performed by sequentially progressing one cycle of:
   injecting a reaction gas of $SiH_4$ to the chamber;
   injecting a first purging gas to the chamber;
   injecting a reaction gas of $WF_6$ to the chamber;
   injecting a second purging gas to the chamber;
   injecting a reaction gas of $NH_3$ to the chamber; and
   injecting a third purging gas to the chamber.

13. The method of claim 12, wherein the first, second, and third purging gasses comprise argon gas.

14. The method of claim 11, wherein the first metal layer of the tungsten material has a thickness of 20 Å to 100 Å.

15. The method of claim 1, wherein the second metal layer is deposited by chemical vapor deposition.

16. A semiconductor device comprising:
   a semiconductor substrate;
   an insulating interlayer having a contact hole, on the semiconductor substrate;
   a barrier metal layer comprising WSiN on an inner surface of the contact hole;
   a first metal layer for nucleation on the barrier metal layer inside the contact hole; and
   a second metal layer on the first metal layer inside the contact hole, filling the contact hole.

17. The semiconductor device of claim 16, wherein the first and second metal layers comprise a tungsten material.

18. The method of claim 10, wherein the first, second, and third purging gasses further comprise hydrogen gas.

19. The method of claim 13, wherein the first, second, and third purging gasses further comprise hydrogen gas.

20. The semiconductor device of claim 16, wherein the barrier layer has a thickness of 20 Å to 100 Å.

* * * * *